United States Patent
Cs et al.

(10) Patent No.: US 8,786,273 B2
(45) Date of Patent: Jul. 22, 2014

(54) SYSTEM AND METHOD FOR IMPROVING ACCURACY OF HIGH VOLTAGE PHASING VOLTMETERS

(75) Inventors: Adishesa Cs, Karnataka (IN); Anil Nagpal, Andhra Pradesh (IN)

(73) Assignee: Honeywell International, Inc., Morristown, NJ (US)

( * ) Notice: Subject to any disclaimer, the term of this patent is extended or adjusted under 35 U.S.C. 154(b) by 577 days.

(21) Appl. No.: 12/888,589

(22) Filed: Sep. 23, 2010

(65) Prior Publication Data

US 2012/0074928 A1 Mar. 29, 2012

(51) Int. Cl.
*G01R 31/02* (2006.01)

(52) U.S. Cl.
USPC ............ 324/72.5; 324/123 R; 324/99 D; 324/107

(58) Field of Classification Search
USPC ....... 73/72, 72.5, 99 D, 107, 119, 123 R, 126, 73/128, 133; 324/72, 72.5, 99 D, 107, 119, 324/123 R, 126, 128, 133
See application file for complete search history.

(56) References Cited

U.S. PATENT DOCUMENTS

| | | | | |
|---|---|---|---|---|
| 3,826,981 A | * | 7/1974 | Ross | 324/72.5 |
| 4,393,347 A | * | 7/1983 | Looper | 324/126 |
| 4,494,212 A | * | 1/1985 | Muellner | 702/107 |
| 4,833,400 A | * | 5/1989 | Boutigny | 324/126 |
| 5,136,234 A | * | 8/1992 | Shaw | 324/72 |
| 6,426,616 B1 | | 7/2002 | Mears et al. | |
| 6,459,252 B1 | * | 10/2002 | Bierer | 324/72.5 |
| 7,336,063 B1 | | 2/2008 | Bierer | |

* cited by examiner

*Primary Examiner* — Hezron E Williams
*Assistant Examiner* — Hoang Nguyen
(74) *Attorney, Agent, or Firm* — Wood, Phillips, Katz, Clark & Mortimer

(57) ABSTRACT

A high voltage phasing voltmeter comprises first and second probes. Each probe comprises an insulated handheld shield supporting an electrode for contacting a high voltage electrical conductor. The electrode is connected in series with a resistor and a capacitor. A meter comprises a housing enclosing an electrical circuit for measuring phasing voltage. The electrical circuit comprises an input circuit for connection to the first and second probes and an amplifier connected between the input circuit and a display. The amplifier measures voltage across the electrodes to provide an indication on the display.

20 Claims, 4 Drawing Sheets

SYSTEM AND METHOD FOR IMPROVING ACCURACY OF HIGH VOLTAGE PHASING VOLTMETERS

CROSS-REFERENCE TO RELATED APPLICATIONS

Not Applicable.

FEDERALLY SPONSORED RESEARCH OR DEVELOPMENT

Not Applicable.

MICROFICHE/COPYRIGHT REFERENCE

Not Applicable.

FIELD OF THE INVENTION

The present invention relates to a high voltage phasing voltmeter to provide accuracy in measuring voltages across utility transmission lines and the like.

BACKGROUND OF THE INVENTION

Electrical power distribution systems often include overhead electrical power distribution lines mounted upon poles by a wide variety of mounting structure. Other distribution systems include underground distribution lines in which protected cables run under the ground surface. It is often necessary to take phase-to-phase voltage measurements across transmission lines while testing for induced or live power line or equipment.

Known high voltage safety line detectors, meters and testers comprise high resistance probes connected in series with a calibrated panel meter to read the voltage across the phase-to-phase or phase-to-ground terminals. They are designed for use as safety tools by high voltage line maintenance workers to verify the status of the line or equipment as nominal, induced or de-energized. Known devices for providing such measurements include contact type and non-contact type. With contact type a reference probe or transmitter and a meter probe or receiver are connected in series with a cable as the loop is closed with load terminals. With the non-contact type each probe has a meter and the probes close the circuit through wireless means.

Accuracy of the meter readings is governed by the geometrical configuration of connecting the probes to transmission lines or other high voltage equipment, by environmental conditions such as distance from nearby electromagnetic fields, and by distance of the cable, meter probe and reference probe from the earth. Particularly, the measurements are largely affected by the electromagnetic interference, stray capacitance effect and coupling from the high voltage fields that are present around electrical transmission lines. Also, the sensing elements add to inaccuracy due to uncertainty and tolerance on design and fabrication. All of these factors act as common mode errors in the meter circuit. Thus, the readings become highly inaccurate and measurements are not suitable for usage.

Adequate insulation and safety must also be addressed in design of high voltage probes. Any failure, such as by short circuit, in the high voltage resistance in the probe results in arcing and breakdown of insulation.

With these problems, the electrical line worker could be misguided on the status of the transmission line while the lines are being maintained. Also, improper use may result in injury to electrical line workers and also damage to the high voltage transmission line system.

The present invention is directed to improvements in high voltage phasing voltmeters.

SUMMARY OF THE INVENTION

In accordance with the invention there is provided a high voltage phasing voltmeter providing accuracy in measurement and safety of operation.

Broadly, there is disclosed in accordance with one aspect of the invention a high voltage phasing voltmeter comprising first and second probes. Each probe comprises an insulated handheld shield supporting an electrode for contacting a high voltage electrical conductor. The electrode is connected in series with a resistor and a capacitor or a resistor potted in the tube. A meter comprises a housing enclosing an electrical circuit for measuring phasing voltage. The electrical circuit comprises an input circuit for connection to the first and second probes and an amplifier connected between the input circuit and a display. The amplifier measures voltage across the electrodes to provide an indication on the display.

It is a feature of the invention that each shield comprises an elongate tube and wherein an inner surface of each tube includes a conductive coating. The conductive coating may be electrically connected to a meter ground circuit.

It is another feature of the invention that the housing is integral with the handheld shield for one of the probes. A cable is electrically connected between the electrical circuit and the other of the probes.

It is a further feature of the invention that the amplifier comprises a common mode rejection differential input amplifier. The amplifier may have unity gain.

In accordance with a further aspect of the invention, the electrical circuit comprises a range selection circuit between the amplifier and the display. The range selection circuit may comprise a variable gain amplifier circuit.

It is still a further feature of the invention that the electrical circuit comprises a battery powered circuit.

There is disclosed in accordance with a further aspect of the invention a high voltage portable phasing voltmeter comprising a first probe and a second probe. Each probe comprises an elongate insulated shield having a handle portion at one end. An electrode extends from a distal end of a shield for contacting a high voltage electrical conductor. A high impedance circuit in the shield comprises a resistor and a capacitor connection in series with the electrode. A meter comprises a housing enclosing an electrical circuit for measuring phasing voltage. The electrical circuit comprises an input circuit, for connection to the first and second probe high impedance circuits, and an amplifier connected between the input circuit and a display. The amplifier measures voltage across the electrodes to provide an indication on the display.

Further features and advantages of the invention will readily apparent from the specification and from the drawings.

DETAILED DESCRIPTION OF THE PREFERRED EMBODIMENT

Figure 1:
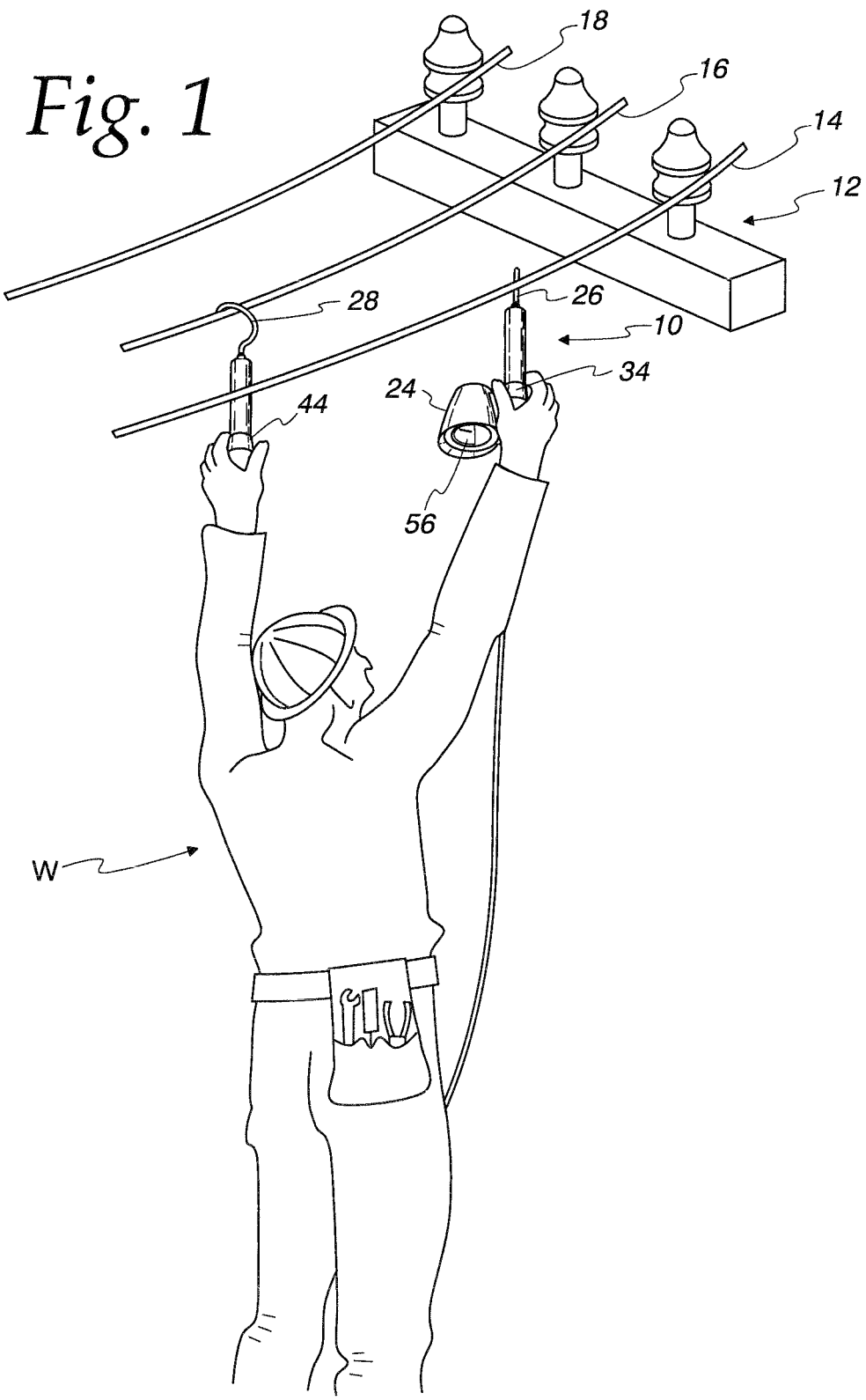
FIG. 1 is a perspective view of use of a high voltage phasing voltmeter in accordance with the invention.

Referring initially to FIG. 1, a portable high voltage phasing voltmeter 10 in accordance with the invention is shown for measuring phase-to-phase voltage between lines in a high voltage transmission line system 12. The transmission line system 12 includes three conductors 14, 16 and 18 carrying high voltage power of alternating current with each line being 120° out of phase with the other lines, as is conventional. The voltmeter 10 may be used by a maintenance worker W for measuring phase-to-phase voltage such as between the electrical conductors 14 and 16 as illustrated in FIG. 1. The voltmeter 10 may also be used to measure other voltages, such as phase to neutral.

Figure 2:
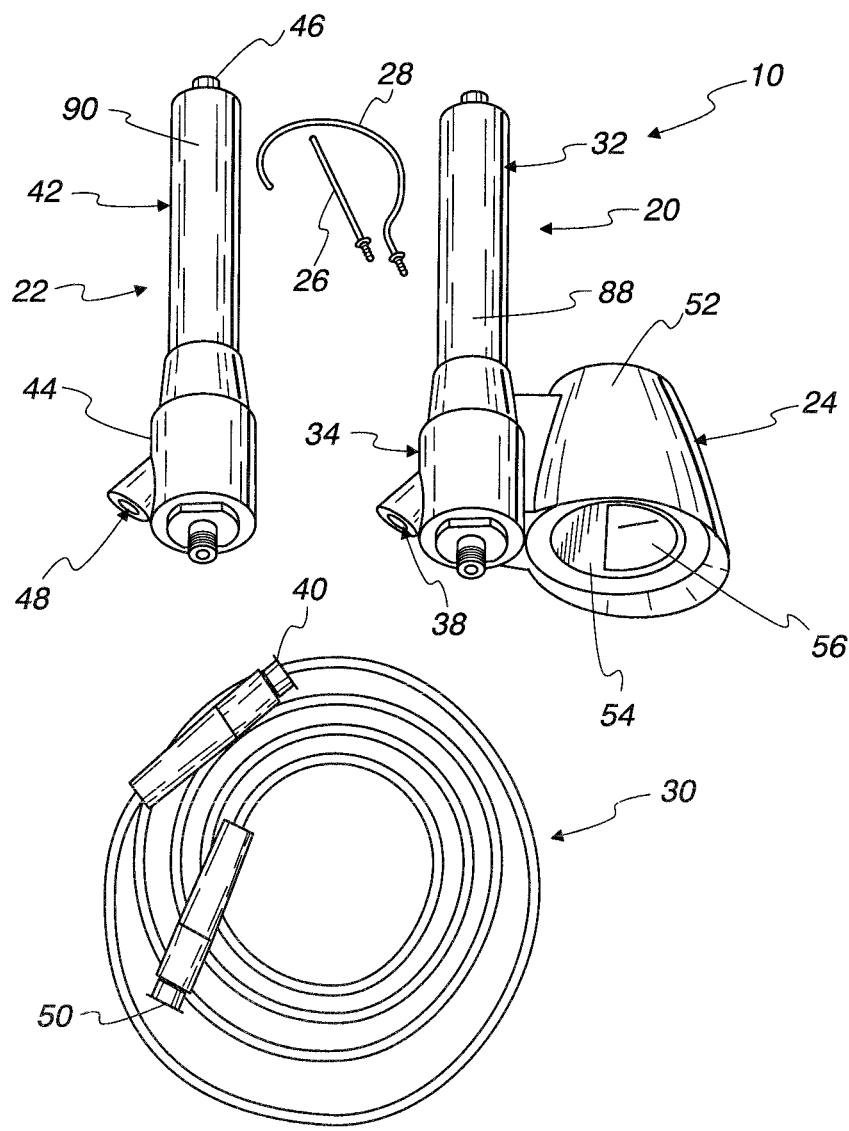
FIG. 2 is a perspective of the individual components of the high voltage phasing voltmeter of FIG. 1 when not in use.

Referring also to FIG. 2, the voltmeter 10 comprises a first probe 20, a second probe 22, a meter 24, a first electrode 26, a second electrode 28 and a coaxial cable 30.

The first probe 20 comprises an elongate insulated shield 32 having a handle portion 34 at one end and a terminal 36 at an opposite end. The terminal 36 is adapted to threadably receive one of the electrodes 26 or 28. A coaxial connector 38 is provided in the handle portion 34, directly opposite the terminal 36, for receiving a first coaxial connector 40 of the cable 30.

The second probe 22 comprises an elongate insulated shield 42 having a handle portion 44 at one end and a terminal 46 at an opposite end. The terminal 46 is adapted to threadably receive one of the electrodes 26 or 28. A coaxial connector 48 is provided in the handle portion 44, directly opposite the terminal 46, for receiving a second coaxial connector 50 of the cable 30.

The meter 24 comprises a housing 52 integrally formed with the first probe handle portion 34. The housing 52 is frustoconical in shape including a bottom bezel 54 through which a display 56 is visible. The display 56 can be an analog display or a digital display, as preferred.

As shown in FIG. 1, the worker W can grip the handheld portions 34 and 44 to contact the lines 14 and 16 with the electrodes 26 and 28, respectively. The meter display 56 is visible to read the measured phase to phase voltage.

Figure 3:
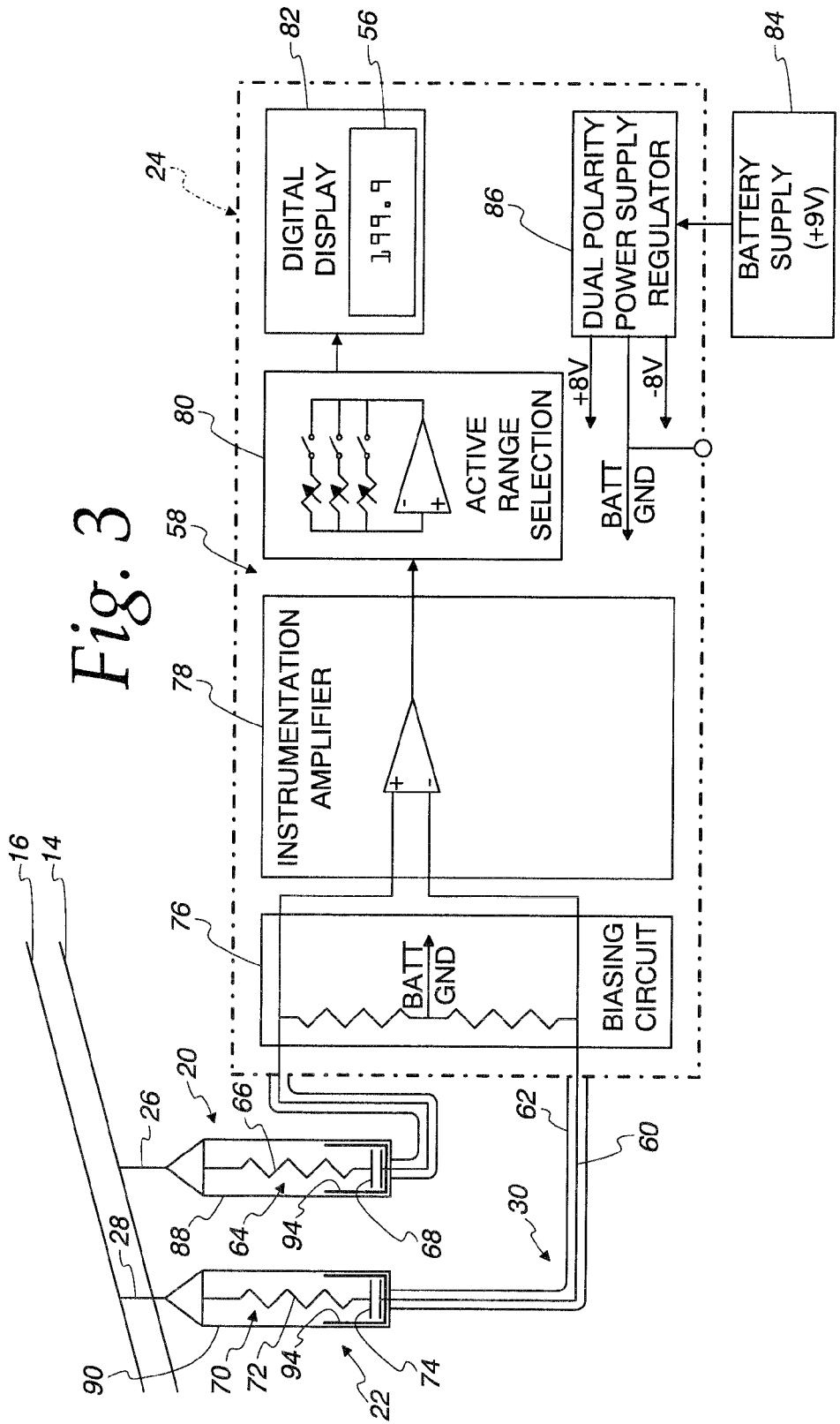
FIG. 3 is a block diagram of the high voltage phasing voltmeter in accordance with the invention.

Referring to FIG. 3, the meter 24 comprises an electrical circuit 58. The electrical circuit 58 is present on a circuit board (not shown) internal to the housing 52.

The cable 30 comprises a conventional coaxial cable. This is illustrated schematically in FIG. 3 with a central conductor 60 surrounded by a conductive shield 62. This is used for connecting the probe connectors 38 and 48, see FIG. 2. FIG. 3 also illustrates similar connections between the first probe 20 and the electrical circuit 58. However, as will be apparent, the connections between electrical components of the first probe 20 and the electrical circuit 58 are internal to the meter housing 52. Thus, FIG. 3 illustrates the circuit schematically, rather than with respect to hardware components of the cable and connectors.

The first probe 20 includes a high impedance circuit 64 comprising a high voltage resistor 66 and high voltage capacitor 68. Similarly, the second probe 22 includes a high impedance circuit 70 comprising a high voltage resistor 72 and high voltage capacitor 74.

The first electrode 26 is connected in series with the first probe resistor 66 and the capacitor 68. The second electrode 28 is connected in series with the second probe resistor 72 and the capacitor 74. The two series connections are electrically connected to a biasing circuit 76. The biasing circuit 76 is connected to an instrumentation amplifier circuit 78, followed by a range selection circuit 80 and a display circuit 82 associated with the display 56. The amplifier circuit 78 comprises a unity gain common mode rejection differential input amplifier. The range selection circuit 80 comprises a variable gain amplifier circuit. Power for the electrical circuit 58 is provided by a battery supply 84, such as a conventional 9-volt battery, connected to a power supply regulator circuit 86 developing +8-volt, −8-volt and battery ground.

The first probe 20 includes an elongate insulated tube 88 forming the shield 32, see FIG. 2. Similarly, the second probe 22 includes an elongate insulated tube 90 forming the shield 42, see FIG. 2. A conductive coating 94 is applied on an inner surface of each tube 88 and 90, proximate the handle portions 34 and 44, respectively. The conductive coatings 94 are electrically connected using the cable shield 62 and internal connections to a meter ground circuit defined by the battery ground.

Figure 4:
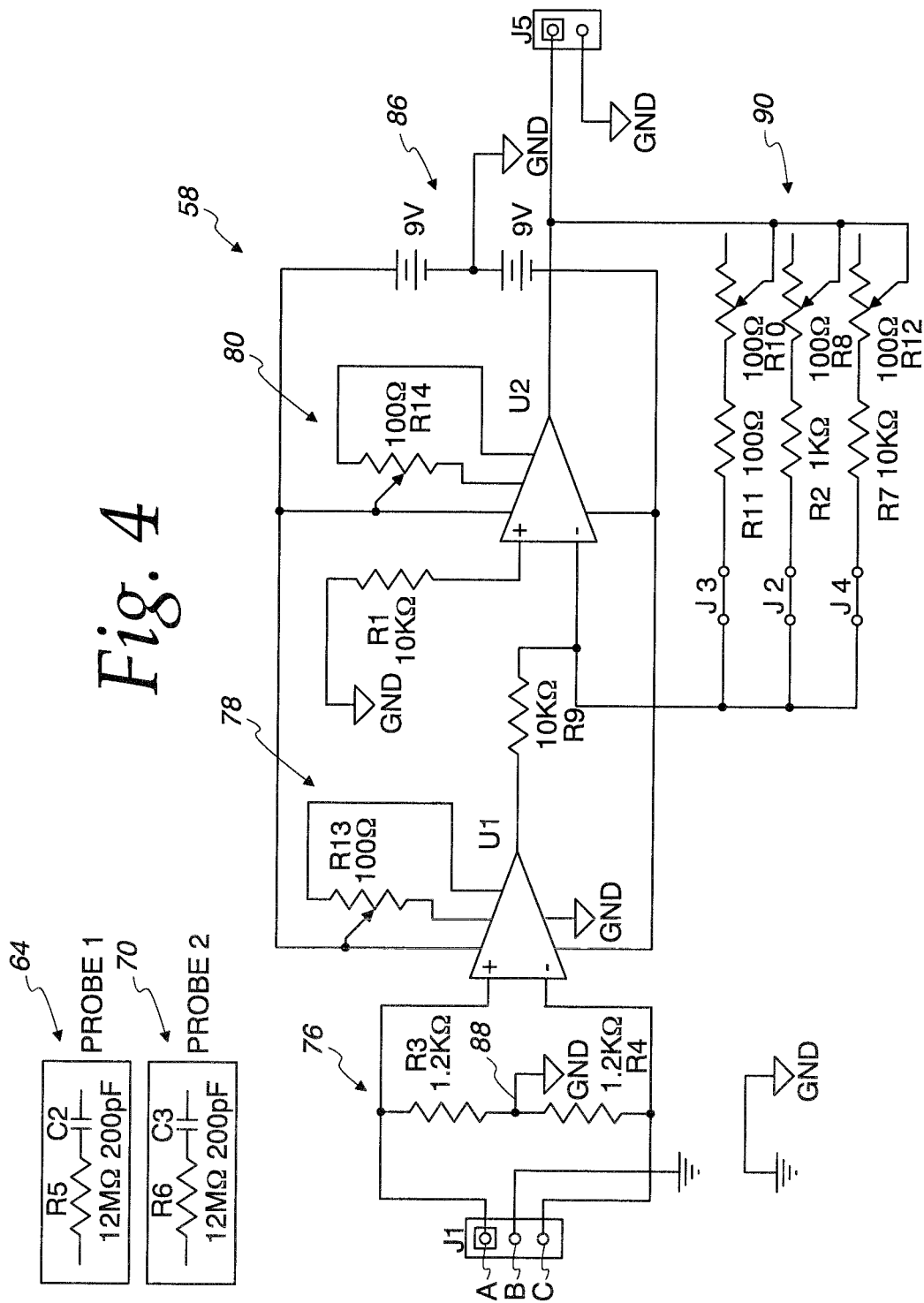
FIG. 4 is an electrical schematic of the high voltage phasing voltmeter in accordance with the invention.

Referring to FIG. 4, a detailed schematic for the electrical circuit 58 is illustrated. A terminal block J1 is illustrated for connection to the probe impedance circuits 64 and 70. The terminal block J1 includes a terminal A for connection to the first probe impedance circuit 64 and a terminal C for connection to the second probe impedance circuit 70. A terminal B is provided for connecting the probe conductive coatings 94 to ground, as discussed above.

The biasing circuit 76 comprises resistors R3 and R4 connected in series across the terminal block A and C terminals. A center node 88 is connected to ground. The same terminals A and C are connected to the non-inverted and inverted inputs, respectively, of an instrumentation amplifier U1. The amplifier U1 may comprise a type AD620 low power instrumentation amplifier. A reference terminal is connected to ground with a potentiometer R13 operating as a gain resistance. The amplifier circuit 78 provides high common mode rejection. The output from the amplifier circuit 78 represents the voltage difference between the probes 20 and 22.

The output from the instrumentation amplifier U1 is connected via a resistor R9 to the inverted input of an operational amplifier U2. The operational amplifier U2 may comprise a type OP177 ultraprecision operational amplifier. The non-inverted input is connected via a resistor R1 to ground. A potentiometer R14 is connected as part of an offset nulling circuit. Active range selection is provided by a range selection circuit 90 connected between the output and the inverting input to provide variable gain. The range selection circuit consists of a series combination of a switch contact J3, a resistor R11 and potentiometer R10; in parallel with a series combination of a switch contact J2, a resistor R2 and potentiometer R8; and in parallel with a series combination of a switch contact J4, a resistor R7 and potentiometer R12. The output from the operational amplifier U2, which represents the amplified voltage difference between the probes 20 and 22, is connected to a terminal block J5 which provides the voltage output signal for connection to the display circuit 82, see FIG. 3. Thus, the display 56 displays the measured voltage difference.

Each range is selected by closing one of the switch contacts J3, J2 or J4. The number of ranges that can be selected and the precise values of the ranges are arbitrary and can be determined as will be apparent to those skilled in the art. The positions of the switches J3, J2 and J4 can be controlled manually or electronically, as will be apparent to those skilled in the art. Which range is selected changes the gain of the amplifier 80.

As described, the high voltage probes 20 and 22 include high voltage dropping resistors and capacitors in series to form each probe. The RC combination offers increased impedance and offers additional safety for any resistor failure and it reduces arcing effects. Inner surfaces of the insulating enclosures of the probes 20 and 22 have a conductive coating 94 which is connected to ground to reduce the capacitive current variation.

The instrumentation amplifier circuit 78 comprises a unity following instrumentation amplifier with high common mode rejection to eliminate common mode parasitic noise effects, including stray capacitance, medium frequency harmonics at the high voltage lines and uncertainties to unsymmetrical components in the probe. This provides active and robust compensation. The biasing circuit 76 and the amplifier circuits U1 and U2 are powered by a dual power supply regulator 86 which draws negligible input power from the battery 84. The active range selection feature is provided by gain adjustment potentiometers and switch contacts in the feedback path of the amplifier U2.

The conductive coating 94 of the probes 20 and 22, the ground of the meter circuit, and the cable shield form a common ground which ensures a stable ground for the entire system.

The schematic diagram of FIG. 4 illustrates representative values for the resistors and capacitors. These values are for one example of a circuit. As is apparent, the precise values could be varied from those shown herein.

Thus, there is provided a high voltage phasing voltmeter providing accuracy in measurement and safety of operation.

The invention claimed is:

1. A high voltage phasing voltmeter comprising:
   first and second probes, each comprising an insulated handheld shield supporting an electrode for contacting a high voltage electrical conductor, the electrode being connected in series with a resistor and a capacitor; and
   a meter comprising a housing enclosing an electrical circuit for measuring phasing voltage, the electrical circuit comprising an input circuit for connection to the first and second probes, the input circuit comprising a biasing circuit, and an amplifier connected between the input circuit and a display, the amplifier comprising an active compensation circuit with high common mode rejection to eliminate common mode parasitic noise effects and developing an output representing voltage difference between the first and second probes to provide an indication on the display.

2. The high voltage phasing voltmeter of claim 1 wherein each shield comprises an elongate tube and wherein an inner surface of each tube included a conductive coating.

3. The high voltage phasing voltmeter of claim 2 wherein the conductive coating is electrically connected to a meter ground circuit.

4. The high voltage phasing voltmeter of claim 1 wherein the housing is integral with the handheld shield for one of the probes.

5. The high voltage phasing voltmeter of claim 4 further comprising a cable electrically connected between the electrical circuit and the other of the probes.

6. The high voltage phasing voltmeter of claim 1 wherein the amplifier comprises a common mode rejection differential input amplifier.

7. The high voltage phasing voltmeter of claim 6 wherein the amplifier has unity gain.

8. The high voltage phasing voltmeter of claim 1 wherein the electrical circuit comprises a range selection circuit between the amplifier and the display.

9. The high voltage phasing voltmeter of claim 8 wherein the range selection circuit comprises a variable gain amplifier circuit.

10. The high voltage phasing voltmeter of claim 1 wherein the electrical circuit comprises a battery powered circuit.

11. A high voltage portable phasing voltmeter comprising:
    a first probe comprising an elongate insulated shield having a handle portion at one end, an electrode extending from a distal end of the shield for contacting a high voltage electrical conductor, and a high impedance circuit in the shield comprising a resistor and a capacitor connected in series with the electrode;
    a second probe comprising an elongate insulated shield having a handle portion at one end, an electrode extending from a distal end of the shield for contacting a high voltage electrical conductor, and a high impedance circuit in the shield comprising a resistor and a capacitor connected in series with the electrode; and
    a meter comprising a housing enclosing an electrical circuit for measuring phasing voltage, the electrical circuit comprising an input circuit, for connection to the first and second probe high impedance circuits, the input circuit comprising a biasing circuit, and an amplifier connected between the input circuit and a display, the amplifier comprising an active compensation circuit with high common mode rejection to eliminate common mode parasitic noise effects and developing an output representing voltage difference between the first and second probes measuring voltage across the electrodes to provide an indication on the display.

12. The high voltage phasing voltmeter of claim 11 wherein each shield comprises an elongate tube and wherein an inner surface of each tube included a conductive coating.

13. The high voltage phasing voltmeter of claim 12 wherein the conductive coating is electrically connected to a meter ground circuit.

14. The high voltage phasing voltmeter of claim 11 wherein the housing is integral with the handle portion of the first probe.

15. The high voltage phasing voltmeter of claim 14 further comprising a cable electrically connected between the electrical circuit and the second probe.

16. The high voltage phasing voltmeter of claim 11 wherein the amplifier comprises an amplifier with high common mode rejection ratio.

17. The high voltage phasing voltmeter of claim 16 wherein the amplifier has unity gain.

18. The high voltage phasing voltmeter of claim 11 wherein the electrical circuit comprises a range selection circuit between the amplifier and the display.

19. The high voltage phasing voltmeter of claim 18 wherein the range selection circuit comprises a variable gain amplifier circuit.

20. The high voltage phasing voltmeter of claim 11 wherein the electrical circuit comprises a battery powered circuit.

* * * * *